United States Patent
Hung et al.

(10) Patent No.: US 7,553,762 B2
(45) Date of Patent: Jun. 30, 2009

(54) METHOD FOR FORMING METAL SILICIDE LAYER

(75) Inventors: Tzung-Yu Hung, Tainan County (TW); Chun-Chieh Chang, Tainan County (TW); Chao-Ching Hsieh, Hsinchu County (TW); Yu-Lan Chang, Kaohsiung (TW); Yi-Wei Chen, Taichung County (TW)

(73) Assignee: United Microelectronics Corp., Hsinchu (TW)

( * ) Notice: Subject to any disclaimer, the term of this patent is extended or adjusted under 35 U.S.C. 154(b) by 97 days.

(21) Appl. No.: 11/673,145

(22) Filed: Feb. 9, 2007

(65) Prior Publication Data

US 2008/0194100 A1 Aug. 14, 2008

(51) Int. Cl.
H01L 21/20 (2006.01)
(52) U.S. Cl. .................. 438/656; 438/651; 438/655; 438/664; 438/682; 257/E21.165; 257/E21.507; 257/E23.017; 257/E23.019
(58) Field of Classification Search .......... 438/637, 438/651–682; 257/E21.165, E21.507, E23.017, 257/E23.019
See application file for complete search history.

(56) References Cited

U.S. PATENT DOCUMENTS

| | | | | |
|---|---|---|---|---|
| 4,737,839 | A * | 4/1988 | Burt | 257/691 |
| 6,440,851 | B1 * | 8/2002 | Agnello et al. | 438/682 |
| 2004/0262649 | A1 * | 12/2004 | Chang et al. | 257/288 |
| 2005/0202673 | A1 * | 9/2005 | Chi et al. | 438/655 |
| 2006/0051961 | A1 * | 3/2006 | Cabral et al. | 438/664 |
| 2006/0057844 | A1 * | 3/2006 | Domenicucci et al. | 438/655 |

* cited by examiner

Primary Examiner—Michael S Lebentritt
(74) Attorney, Agent, or Firm—J.C. Patents

(57) ABSTRACT

The invention provides a method for forming a metal silicide layer. The method comprises steps of providing a substrate and forming a nickel-noble metal layer over the substrate. A grain boundary sealing layer is formed on the nickel-noble metal layer and then an oxygen diffusion barrier layer is formed on the grain boundary sealing layer. Thereafter, a rapid thermal process is performed to transform a portion of the nickel-noble metal layer into a metal silicide layer. Finally, the oxygen diffusion barrier layer, the grain boundary sealing layer and the rest portion of the nickel-noble metal layer are removed.

25 Claims, 2 Drawing Sheets

METHOD FOR FORMING METAL SILICIDE LAYER

BACKGROUND OF THE INVENTION

1. Field of Invention

The present invention relates to a semiconductor process. More particularly, the present invention relates to a method for forming a metal silicide layer.

2. Description of Related Art

As the integration of semiconductor device increases, the pattern and the line width in the device gradually decrease. The contact resistance of the gate and the conductive line in the device thereby increases, leading to a higher RC delay and adversely affecting the operating speed. Since the resistance of metal silicide is lower than polysilicon and the thermal stability of metal silicide is higher than a typical inter-metal dielectric material, forming metal silicide on a gate can lower the resistance between the gate and the metal interconnect.

Among the various metal silicide, nickel silicide currently attracts much attention because of its low resistivity. However, during the removal process for removing unreacted metal nickel after the thermal process for transforming a portion of the metal nickel into the nickel silicide is performed, the etchant agent used in the removal process would attack the nickel silicide through the grain boundary of the nickel silicide. Therefore the etchant agent penetrates into the nickel silicide and damages the nickel silicide. Hence, the electric performance of the nickel silicide is decreased.

SUMMARY OF THE INVENTION

Accordingly, at least one objective of the present invention is to provide a method for forming a metal silicide layer capable of sealing the grain boundary of the nickel silicide layer.

At least another objective of the present invention is to provide a method for forming a metal silicide layer capable of preventing the nickel silicide layer from being attacked by the etchant agent.

To achieve these and other advantages and in accordance with the purpose of the invention, as embodied and broadly described herein, the invention provides a method for forming a metal silicide layer. The method comprises steps of providing a substrate and forming a nickel-noble metal layer over the substrate. A grain boundary sealing layer is formed on the nickel-noble metal layer and then an oxygen diffusion barrier layer is formed on the grain boundary sealing layer. Thereafter, a rapid thermal process is performed to transform a portion of the nickel-noble metal layer into a metal silicide layer. Finally, the oxygen diffusion barrier layer, the grain boundary sealing layer and the rest portion of the nickel-noble metal layer are removed.

According to one embodiment of the present invention, the grain boundary sealing layer is made of transition metal.

According to one embodiment of the present invention, the material of the grain boundary sealing layer is selected from a group consisting of Sc, Ti, V, Cr, Mn, Fe, Co, Ni, Cu, Zn and the combination thereof.

According to one embodiment of the present invention, the atom size of the material of the grain boundary sealing layer is similar to that of Ti.

According to one embodiment of the present invention, the nickel-noble metal layer contains the noble metal selected from a group consisting of Pt, Pd, Mo, Ag, Au and the combination thereof.

According to one embodiment of the present invention, the weight percentage of the noble metal in the nickel-noble metal layer is about 5~10%.

According to one embodiment of the present invention, after the oxygen diffusion barrier layer is formed and before the thermal process is performed, the method further comprises a step of forming a cap layer on the oxygen diffusion barrier layer.

According to one embodiment of the present invention, the material of the cap layer is selected from a group consisting of Sc, Ti, V, Cr, Mn, Fe, Co, Ni, Cu, Zn and the combination thereof.

According to one embodiment of the present invention, the material of the oxygen diffusion barrier layer is selected from a group consisting of TiN, WN, Ta, TaN and the combination thereof.

According to one embodiment of the present invention, the metal silicide layer comprises nickel silicide and noble-metal silicide.

The present invention also provides a method for forming a metal silicide layer. The method comprises steps of providing a substrate and then forming a nickel alloy layer over the substrate. A surface treatment layer is formed on the nickel alloy layer, wherein the surface treatment layer has a sandwich structure comprising, from the bottom to the top of the sandwich structure, a first metal layer, a barrier layer and a second metal layer. A rapid thermal process is performed to transform a portion of the nickel alloy layer into a nickel silicide-containing layer. The surface treatment layer and the rest portion of the nickel alloy layer are removed.

According to one embodiment of the present invention, the nickel alloy layer comprises a noble metal selected from a group consisting of Pt, Pd, Mo, Ag, Au and the combination thereof.

According to one embodiment of the present invention, the weight percentage of the noble metal in the nickel alloy layer is about 5~10%.

According to one embodiment of the present invention, the first metal layer is served as a grain boundary sealing layer for the nickel alloy layer.

According to one embodiment of the present invention, the first metal layer is made of transition metal.

According to one embodiment of the present invention, the material of the first metal layer is selected from a group consisting of Sc, Ti, V, Cr, Mn, Fe, Co, Ni, Cu, Zn and the combination thereof.

According to one embodiment of the present invention, the atom size of the material of the grain boundary sealing layer is similar to that of Ti.

According to one embodiment of the present invention, the material of the second metal layer is as same as that of the first metal layer.

According to one embodiment of the present invention, the material of the second metal layer is selected from a group consisting of Sc, Ti, V, Cr, Mn, Fe, Co, Ni, Cu, Zn and the combination thereof.

According to one embodiment of the present invention, the material of the barrier layer is selected from a group consisting of TiN, WN, Ta, TaN and the combination thereof.

In the present invention, the grain boundary sealing layer covers the entire of the nickel alloy layer so that the atoms in the grain boundary sealing layer fill up the grain boundary of the metal silicide layer transformed from the nickel alloy layer. Therefore, the topography of the metal silicide layer is relatively smooth. Hence, the metal silicide layer can be prevented from being attacked by the removal agent, the high temperature hydrogen-chloride based etchant. Thus, the reliability of the device is increased.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
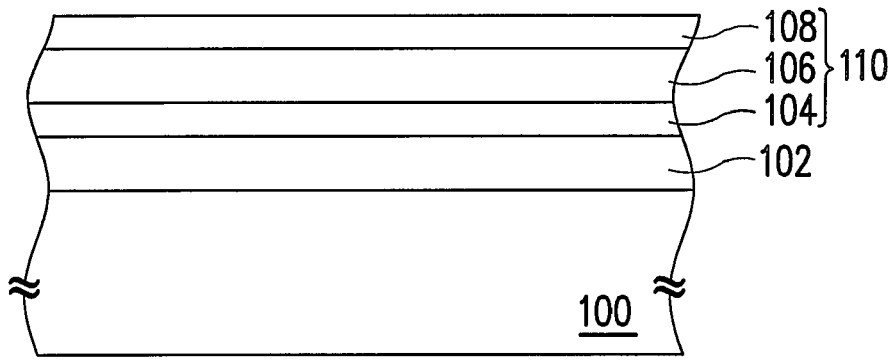
FIGS. 1A through 1C are cross-sectional views showing a method for forming a metal silicide layer according to a preferred embodiment of the invention.
Figure 1B:
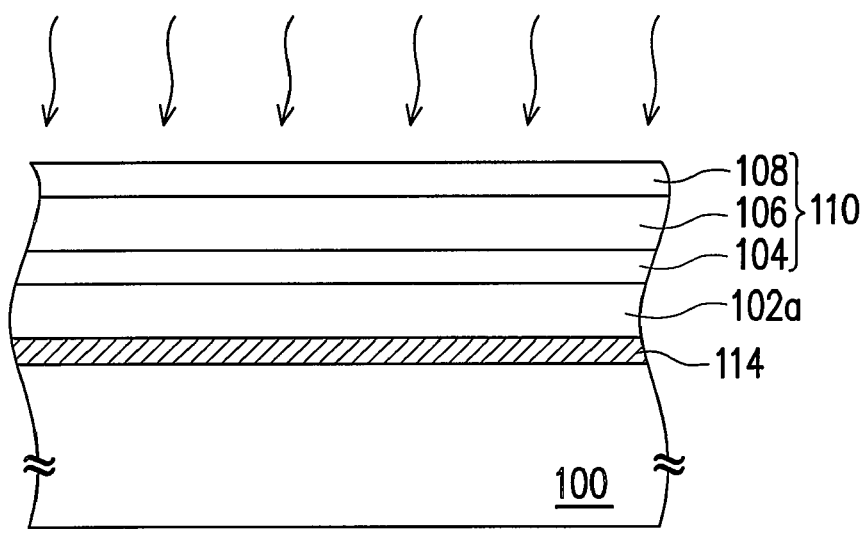
Figure 1C:
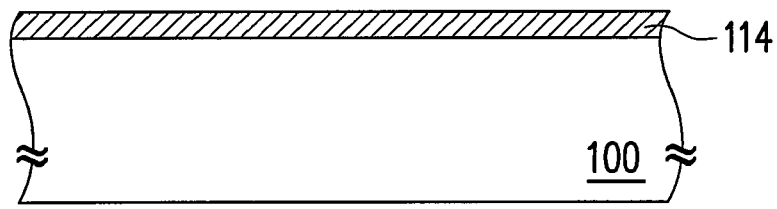
Figure 2:
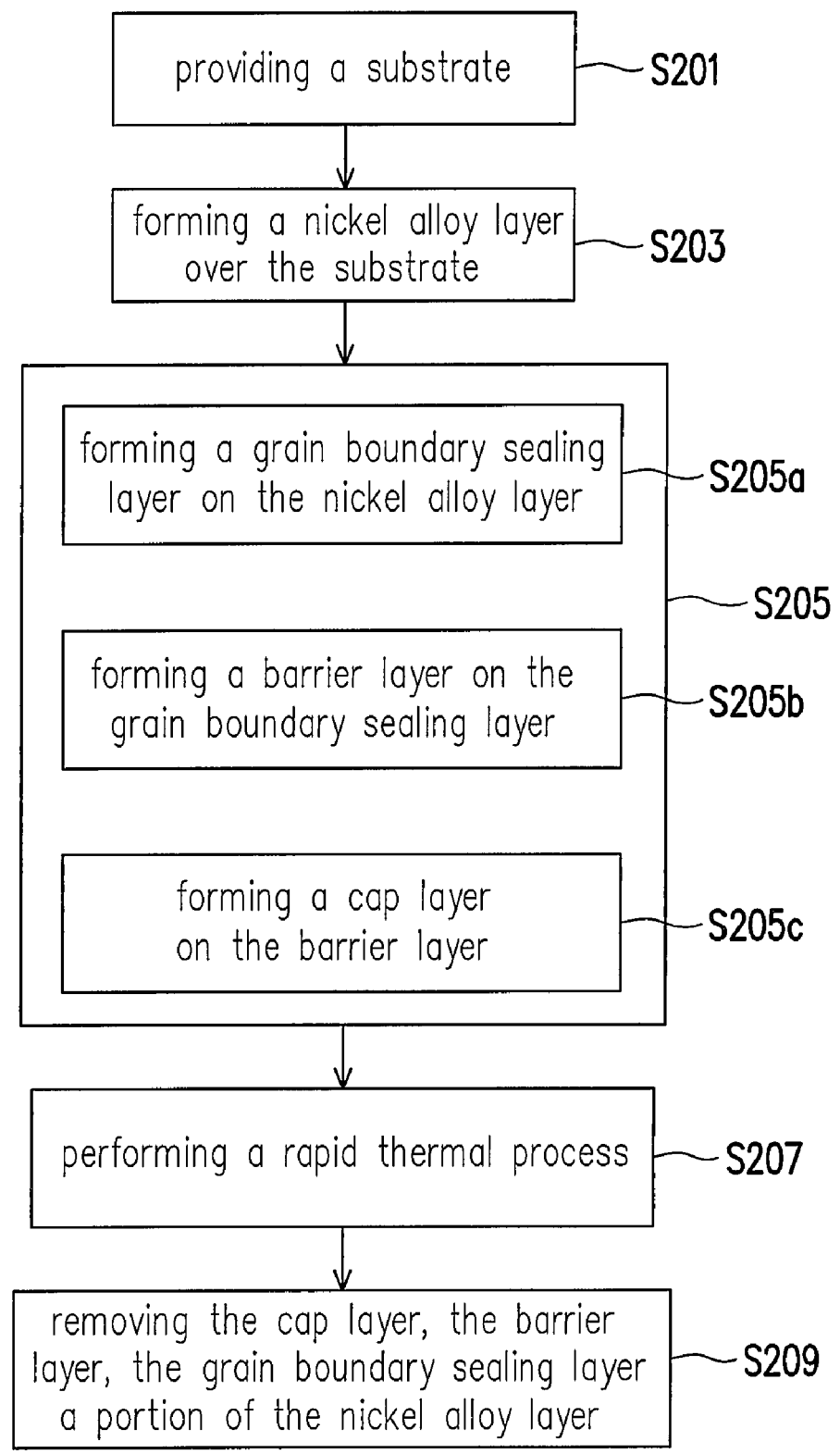
FIG. 2 is a process flow showing a method for forming a metal silicide layer according to one embodiment of the present invention.

FIGS. 1A through 1C are cross-sectional views showing a method for forming a metal silicide layer according to a preferred embodiment of the invention. FIG. 2 is a process flow showing a method for forming a metal silicide layer according to one embodiment of the present invention. As shown in FIG. 1A and FIG. 2, in the step S201, a substrate 100 is provided. The substrate 100 has at least one semiconductor device (not shown) formed thereon. Then, in the step S203, a nickel alloy layer 102 is formed over the substrate 100. The nickel alloy layer 102 can, for example, contain the noble metal selected from a group consisting of Pt, Pd, Mo, Ag, Au and the combination thereof. That is, the nickel alloy layer 102 can be a nickel-noble metal layer. Furthermore, the weight percentage of the noble metal in the nickel alloy layer is about 5~10%. Moreover, the method for forming the nickel alloy layer 102 can be the conventional deposition process such as chemical vapor deposition.

Thereafter, in the step S205, a surface treatment layer 110 with a sandwich structure is formed on the nickel alloy layer 102. Moreover, from the bottom to the top, the surface treatment layer 110 is composed of a grain boundary sealing layer 104, a barrier layer 106 and a cap layer 108. The method for forming the surface treatment layer comprises steps of forming the grain boundary sealing layer 104 on the nickel alloy layer 102 (step S205a), forming the barrier layer 106 on the grain boundary sealing layer 104 (step S205b) and forming the cap layer 108 on the barrier layer 106 (step S205c). It should be noticed that the atoms in the grain boundary sealing layer 104 are used to diminish the grain boundary of the metal silicide formed in the later process steps. Moreover, the thickness of the grain boundary sealing layer 104 is about 10~200 angstroms. Preferably, the thickness of the grain boundary sealing layer 104 is larger than 50 angstroms. Furthermore, the grain boundary sealing layer 104 can be, for example, made of transition metal. More specifically, the material of the grain boundary sealing layer 104 is selected from a group consisting of Sc, Ti, V, Cr, Mn, Fe, Co, Ni, Cu, Zn and the combination thereof. In addition, the atom size of the material of the grain boundary sealing layer is similar to that of Titanium. Also, the material property of the grain boundary sealing layer 104 should not be chemical inactive so that the grain boundary sealing layer 104 can be easily removed by any kind of removal agent in the later process steps.

Moreover, the barrier layer 106 is served as an oxygen diffusion barrier for blocking the oxygen and preventing the nickel alloy layer 102 from being oxidized. The material of the barrier layer 106 can be, for example, selected from a group consisting of TiN, WN, Ta, TaN and the combination thereof. Moreover, the cap layer 108 can be optionally formed on the barrier layer 106 and the material of the cap layer can be, for example, as same as that of the grain boundary sealing layer 104. That is, the cap layer 108 can be made of transition metal. Also, the material of the cap layer 108 can be, for example, selected from a group consisting of Sc, Ti, V, Cr, Mn, Fe, Co, Ni, Cu, Zn and the combination thereof.

As shown in FIG. 1B together with FIG. 2, in the step S207, a rapid thermal process 112 is performed to transform a portion of the nickel alloy layer 102 into a metal silicide layer 114. That is, the metal silicide layer 114 is formed by reacting the nickel alloy layer 102 with the semiconductor device containing silicon. Therefore, the rest portion of the nickel alloy layer 102 which is not reacted with the semiconductor device containing silicon is labeled 102a. Moreover, the metal silicide 114 comprises nickel silicide and noble-metal silicide.

As shown in FIG. 1C together with FIG. 2, in the step S209, a removal process is performed to remove the surface treatment layer 110 and the rest portion of the nickel alloy layer 102a. The method for removing the cap layer 108, the barrier layer 106, the grain boundary sealing layer 104 together with the rest portion of the nickel alloy layer 102a can be a wet etching process with the use of a hydrogen-chloride based etchant in a relatively high temperature. Thereafter, the metal silicide layer 114 is exposed.

In the present invention, during the rapid thermal process 112 is performed to transform a portion of the nickel alloy layer 102 into the metal silicide layer 114, the atoms in the grain boundary sealing layer 104 fill up the grain boundary of the metal silicide such as nickel silicide. Hence, the topography of the metal silicide is relatively smooth. Therefore, in the step for removing the surface treatment layer 110 and the rest portion of the nickel alloy layer 102a, the metal silicide layer can be prevented from being attacked by the high temperature hydrogen chloride through the grain boundary thereof.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method for forming a metal suicide layer, comprising:
   providing a substrate;
   forming a nickel-noble metal layer over the substrate;
   forming a metal grain boundary sealing layer on the nickel-noble metal layer;
   forming an oxygen diffusion barrier layer on the grain boundary sealing layer;
   performing a rapid thermal process for transforming a portion of the nickel-noble metal layer into a metal silicide layer; and
   completely removing the oxygen diffusion barrier layer, the grain boundary sealing layer and the rest portion of the nickel-noble metal layer.

2. The method of claim 1, wherein the grain boundary sealing layer is made of transition metal.

3. The method of claim 1, wherein the material of the grain boundary sealing layer is selected from a group consisting of Sc, Ti, V, Cr, Mn, Fe, Co, Ni, Cu, Zn and the combination thereof.

4. The method of claim 1, wherein the atom size of the material of the grain boundary sealing layer is similar to that of Ti.

5. The method of claim 1, wherein the nickel-noble metal layer contains the noble metal selected from a group consisting of Pt, Pd, Mo, Ag, Au and the combination thereof.

6. The method of claim 1, wherein the weight percentage of the noble metal in the nickel-noble metal layer is about 5~10%.

7. The method of claim 1, after the oxygen diffusion barrier layer is formed and before the thermal process is performed, it further comprises a step of forming a cap layer on the oxygen diffusion barrier layer.

8. The method of claim 7, wherein the material of the cap layer is selected from a group consisting of Sc, Ti, V, Cr, Mn, Fe, Co, Ni, Cu, Zn and the combination thereof.

9. The method of claim 1, wherein the material of the oxygen diffusion barrier layer is selected from a group consisting of TiN, WN, Ta, TaN and the combination thereof.

10. The method of claim 1, wherein the metal silicide layer comprises nickel silicide and noble-metal silicide.

11. A method for forming a metal silicide layer, comprising:
providing a substrate;
forming a nickel alloy layer over the substrate;
forming a surface treatment layer on the nickel alloy layer, wherein the surface treatment layer has a sandwich structure comprising, from the bottom to the top of the sandwich structure, a first metal layer, a barrier layer and a second metal layer;
performing a rapid thermal process to transform a portion of the nickel alloy layer into a nickel silicide-containing layer subsequent to the formation of the surface treatment layer; and
completely removing the surface treatment layer and the rest portion of the nickel alloy layer.

12. The method of claim 11, wherein the nickel alloy layer comprises a noble metal selected from a group consisting of Pt, Pd, Mo, Ag, Au and the combination thereof.

13. The method of claim 12, wherein the weight percentage of the noble metal in the nickel alloy layer is about 5~10%.

14. The method of claim 11, wherein the first metal layer is served as a grain boundary sealing layer for the nickel alloy layer.

15. The method of claim 11, wherein the first metal layer is made of transition metal.

16. The method of claim 11, wherein the material of the first metal layer is selected from a group consisting of Sc, Ti, V, Cr, Mn, Fe, Co, Ni, Cu, Zn and the combination thereof.

17. The method of claim 11, wherein the atom size of the material of the grain boundary sealing layer is similar to that of Ti.

18. The method of claim 11, wherein the material of the second metal layer is as same as that of the first metal layer.

19. The method of claim 11, wherein the material of the second metal layer is selected from a group consisting of Sc, Ti, V, Cr, Mn, Fe, Co, Ni, Cu, Zn and the combination thereof.

20. The method of claim 11, wherein the material of the barrier layer is selected from a group consisting of TiN, WN, Ta, TaN and the combination thereof.

21. A method for forming a metal suicide layer, comprising:
providing a substrate;
forming a nickel alloy layer over the substrate;
forming a surface treatment layer on the nickel alloy layer, wherein the surface treatment layer has a sandwich structure comprising a first metal layer, a conductive barrier layer and a second metal layer, wherein the second metal layer is formed directly on the conductive barrier layer and the first metal layer is formed directly on the conductive barrier layer;
performing a rapid thermal process to transform a portion of the nickel alloy layer underneath the surface treatment layer into a nickel silicide-containing layer; and
completely removing the surface treatment layer and the rest portion of the nickel alloy layer.

22. The method of claim 21, wherein the first metal layer comprises a transition metal.

23. The method of claim 21, wherein a material of the first metal layer comprises at least one of Sc, Ti, V, Cr, Mn, Fe, Co, Ni, Cu, Zn and the combination thereof.

24. The method of claim 21, wherein a material of the conductive barrier layer comprises at least one of TiN, WN, Ta and TaN.

25. The method of claim 21, wherein a material of the second metal layer comprises at least one of Sc, Ti, V, Cr, Mn, Fe, Co, Ni, Cu, Zn and the combination thereof.

* * * * *